(12) United States Patent
Kitani et al.

(10) Patent No.: US 6,323,891 B1
(45) Date of Patent: Nov. 27, 2001

(54) IMAGING APPARATUS WITH THERMAL DISCHARGER FOR TRANSFERRING HEAT TO COOL PHOTOELECTRIC TRANSFER ELEMENTS

(75) Inventors: Masashi Kitani, Yokohama; Yoshinori Shimamura, Oiso-machi; Kenji Kajiwara, Tokyo, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/266,828

(22) Filed: Mar. 12, 1999

(30) Foreign Application Priority Data

Mar. 16, 1998 (JP) .................................... 10-065305
Mar. 9, 1999 (JP) .................................... 11-061576

(51) Int. Cl.⁷ .............................. B41J 2/435; H01L 23/34
(52) U.S. Cl. ......................... 347/263; 257/713; 257/719
(58) Field of Search .................................. 347/263, 238; 250/208.1, 484.2; 257/712, 720, 714, 713, 719; 165/86; 348/244

(56) References Cited

U.S. PATENT DOCUMENTS

| 4,230,945 | 10/1980 | Meir et al. ....................... 250/370.15 |
| 5,332,031 | * 7/1994 | Kiga ......................................... 165/86 |
| 5,508,740 | * 4/1996 | Miyaguchi et al. .................. 348/244 |
| 5,596,200 | 1/1997 | Sharma et al. .................... 250/370.14 |
| 5,596,228 | * 1/1997 | Anderton et al. ..................... 257/714 |
| 5,811,790 | * 9/1998 | Endo et al. ........................ 250/208.1 |

FOREIGN PATENT DOCUMENTS 0291351   11/1988   (EP) .
2625332    6/1989   (FR) .

OTHER PUBLICATIONS

Patent Abstracts of Japan, 18, 162 (P–1712) for JP 05–333157, dated Dec. 17, 1993.
Patent Abstracts of Japan, 7, 094 (E–171) for JP 58–017791, dated Feb. 2, 1983.
Patent Abstracts of Japan, 13, 355 (P–914) for JP 1–114780, dated May 8, 1989.

* cited by examiner

Primary Examiner—Hai C. Pham
(74) Attorney, Agent, or Firm—Fitzpatrick, Cella, Harper & Scinto

(57) ABSTRACT

An imaging apparatus includes a substrate, photoelectric transfer elements arranged on the substrate, a semiconductor device located in association with the photoelectric transfer elements and a thermal device for discharging heat coming from the semiconductor device to the outside. The thermal device additionally contacts the substrate and acts to cool the photoelectric transfer elements.

4 Claims, 14 Drawing Sheets

IMAGING APPARATUS WITH THERMAL DISCHARGER FOR TRANSFERRING HEAT TO COOL PHOTOELECTRIC TRANSFER ELEMENTS

BACKGROUND OF THE INVENTION

1. Field of the Invention

This invention relates to an imaging apparatus and, more particularly, it relates to an imaging apparatus adapted to be suitably used for the image input section of a digital copying machine, a scanner, a medical image input equipment or a non-destructive tester.

2. Related Background Art

An imaging apparatus of the type under consideration may typically be used for the image input section of medical or non-destructive inspection equipment. Such equipment may be designed to irradiate an object of inspection with radioactive rays such as X-rays or γ-rays, convert the wavelength of the rays transmitted through the object of inspection into the photosensitive wavelength range of the photo-detecting section of the equipment by means of a wavelength changer such as a fluorescent plate and then convert the detected rays into electric signals in the photo-detector to produce electric information on the object of inspection.

FIG. 1 of the accompanying drawings schematically illustrates a known imaging apparatus of the above described type.

Referring to FIG. 1, it comprises a fluorescent plate 1, photoelectric transfer elements 2a for converting visible light into electric signals, sensor substrates 2b, spacers 3a, TAB films 5a operating as flexible circuit substrates, a moisture-proof film 6, a base 7, an apparatus cabinet 8, a frame member 8a, a covering member (grid) 8b, a bottom member 8c, an adhesive layer 9, ICs 10a (for reading signals), radiator sheets 10c, circuit substrates 15, radiator fins 16 and spacers 17. Arrow 201 in FIG. 1 indicates the direction along which a load is normally applied to (or radioactive rays strike) the apparatus.

As seen from FIG. 1, an imaging apparatus of the type under consideration is based on combining photoelectric transfer elements 2a and a fluorescent plate 1. The photoelectric transfer elements 2a typically comprises amorphous silicon film (hereinafter referred to as a-Si film) as photoelectric conversion layer because it can be formed with ease on a sensor substrate 2b that may be a glass substrate having a large surface area and it can be used not only for photoelectric transfer elements 2a but also as semiconductor material for preparing switch TFTs that operate as switching devices. A-Si film is popularly used as semiconductor material for preparing photoelectric transfer elements 2a because both photoelectric transfer elements 2a and their respective switch TFTs (not shown) can be formed on a glass substrate 2b in a same single process by using it as semiconductor material.

A glass substrate is popularly used for each of the substrates (sensor substrates) 2b carrying photoelectric transfer elements 2a because they are required to be free from chemical reactions with the semiconductor devices of the apparatus, resist the high temperature of the semiconductor forming process and maintain dimensional stability. The fluorescent plate 1 is prepared by applying a fluorescent material of a metal compound to a resin plate. The gap separating the fluorescent plate 1 and the photoelectric transfer elements 2a has to be held to a sufficiently small value (typically less than tens of several μm) relative to the size of the pixels (more than a hundred μm) of the photoelectric transfer elements 2a and, in most cases, the fluorescent plate 1 and the substrates 2b are bonded together by means of an adhesive agent.

When the photoelectric transfer elements 2a are, or the fluorescent plate 1 is, required to be moisture-impermeable, both the fluorescent plate 1 and the photoelectric transfer elements 2a may be wrapped and hermetically sealed by a moisture-impermeable and X-ray transmissive film (e.g., evaporated Al film) 6. Then, the drive circuit substrate 15 for driving the photoelectric transfer elements 2a and reading data therefrom is fitted to the rear surface of the sensor substrates 2b carrying the photoelectric transfer elements 2a thereon with spacers 17 interposed therebetween and subsequently semiconductor circuit devices (electronic components) 5c for driving the converters are mounted thereon. Then, the substrates 2b are rigidly secured to the surface of the base 7 by means of an adhesive layer 9. Thereafter, the base 7 is fitted to the bottom plate 8c of the apparatus cabinet 8 with spacers 3a interposed therebetween, the bottom plate 8c being adapted to operate as holder for the above listed components.

Such imaging apparatus are conventionally used for X-ray photography as stationary apparatus. However, in recent years, there is an increasing demand for lightweight, compact and portable imaging apparatus adapted to rapid imaging operations for producing fine images.

Additionally, imaging apparatus having the above described configuration are required to safeguard the substrate 2b and other related components against impacts that can be applied thereto during transportation and the apparatus are also required to be safeguarded as a whole against deformation, e.g., that of the closure 8b of the apparatus cabinet 8, that can be caused by the external load 201 (mainly the weight of the person to be photographed) of the apparatus during X-ray photographing operations.

Meanwhile, the use of heat-radiating members such as radiator fins 16 for releasing heat from the ICs (integrated circuit devices) 10a including signal reading ICs and driver ICs arranged on the flexible circuit substrate 5a has been proposed. Additionally, the use of a specifically prepared member has been proposed in order to shield the drive circuit and the ICs from X-rays and other radioactive rays because radioactive rays irradiated onto the apparatus can give rise to operation errors on the part of the semiconductor circuit devices (electronic components) 5c arranged on the drive circuit substrate 15 and the drive circuit including the drive ICs 10a arranged on the flexible circuit substrate 5a and even destruct the semiconductor circuit devices 5c. For example, a lead plate may be used to completely cover the base in order to make the apparatus free from troubles attributable radioactive rays. Obviously, however, such an arrangement is against the attempt for producing a downsized and lightweight imaging apparatus.

Therefore, there is a problem how a down-sized, lightweight and portable imaging apparatus can be realized by taking the requirement of safeguarding the sensor substrates 2b against impacts that can be applied to them during transportation and that of preventing the apparatus cabinet from being deformed by the load applied to the apparatus during the operation of X-ray photographing to adversely affect the performance of the photoelectric transfer elements into due consideration.

In the case of the above described conventional apparatus, the base 7 for holding the sensor substrates 2b carrying thereon photoelectric transfer elements 2a, the bottom plate 8c of the apparatus cabinet 8 rigidly securing the base 7, the frame member 8a of the apparatus cabinet 8 arranged around the above listed components, the heat-radiating members 16 of the drive ICs 10a and the lead plate (not shown) for shielding the apparatus against radioactive rays including X-rays are all heavy and bulky and hence operate against the attempt for realizing a lightweight imaging apparatus. Additionally, the drive ICs, the signal reading ICs in particular, have to be provided with respective heat-radiating members on a one-to-one basis in order to ensure stable temperature-related characteristics required for reading analog signals correctly. However, such an arrangement inevitably increase the number of components to operate against the attempt for realizing a down-sized imaging apparatus.

FIG. 2 of the accompanying drawings is a schematic cross sectional view of another known imaging apparatus realized in the form of a cassette. The outer frame of the apparatus includes a grid 8b secured to an apparatus cabinet 8 by means of screws. A radiation-sensitive solid imaging section is arranged within range 5103 defined by dotted lines in the cassette in FIG. 2. FIGS. 3 and 4 respectively show a schematic cross sectional view and a schematic plan view of the radiation-sensitive solid imaging section. It includes sensor substrates 2b carrying on the upper surface thereof photoelectric transfer elements that operate as light receiving section of the apparatus and a pixel region 5205 where photoelectric transfer elements and TFT devices are arranged. The sensor substrates 2b and the base 7 supporting it are rigidly secured to each other by means of an adhesive agent 5207. The sensor substrates 2b are aligned with each other so as to two-dimensionally show a regular pitch of arrangement of pixels before they are rigidly secured onto the base 7 typically in order to produce a large substrate because the use of a plurality of small substrates is advantageous as they can be manufactured at high yield. In other words, it may be replaced by a single large substrate to eliminate the need of using a base if such large substrates can also be manufactured at high yield.

The fluorescent plate 1 for converting radioactive rays into visible rays of light is typically prepared by applying a granular fluorescent material such as $CaWO_4$ or $Gd_2O_2S:Tb^{3+}$ onto a resin plate.

In FIG. 3, reference numeral 5210 denotes drawer electrode sections for receiving input signals for driving the photoelectric transfer elements and the TFT devices from an input system and transmitting output signals obtained by reading X-ray information to an output system, said input system and said output system being external relative to the sensor substrates. The drawer electrode sections are connected respectively to printed circuit substrates 15 by way of flexible circuit substrates 5a, which flexible circuit substrates 5a carry ICs thereon, each being provided with an input signal or output signal processing circuit. Additionally, a sealing member 5214 is arranged at the junction of each of the drawer electrode sections and the corresponding flexible circuit substrate and typically made of silicon resin, acrylic resin or epoxy resin.

The moisture-proof film 6 that is impermeable to moisture and radiation transmittable is typically a metal film formed by evaporation of Al as described above. The metal film is arranged on the fluorescent plate with an adhesive layer 5216 interposed therebetween. This metal film is used to hermetically seal the fluorescent plate, the photoelectric transfer elements and the TFT devices when the photoelectric transfer elements and the TFT devices are required to be protected against moisture and electromagnetic waves. In order to ensure the hermetically sealed condition of the fluorescent plate, the photoelectric transfer elements and the TFT devices, a sealing material 5217 is applied onto the metal film to fill any possible gaps existing among the sensor substrates.

The radiation-sensitive solid imaging section having a configuration as described above is then supported by support pillars 5104 within the cassette and rigidly secured to the support pillars 5104 and the closure 8b, which is a grid, by means of an adhesive agent or an agglutinative agent or by means of anchoring members 5105, each carrying an adhesive agent or a agglutinative agent on the top and under the bottom thereof. Then, both the flexible circuit substrates 5a and the printed circuit substrates 15 are secured to the cabinet 8 by means of respective fitting plates 5106 and screws.

In view of the heat emitted from the ICs 10a mounted on the flexible circuit substrates 5a, the fitting plates 5106 are adapted to provide heat conduction paths leading to the cabinet 8 and the cabinet 8 is provided with plural vent holes 5107 to allow air to freely circulate within the cassette as heat releasing measures.

In the imaging apparatus configured in a manner as described above, radioactive rays coming from a radiation source and entering the cassette after passing through the object of inspection are converted into rays of visible light (having a wavelength sensed by the sensor) within the fluorescent plate. The obtained rays of visible light are then made to pass through the adhesive agent arranged directly below the fluorescent plate and enter the photoelectric transfer elements arranged on the sensor substrates. The light received by the photoelectric transfer elements is then photoelectrically converted and a two-dimensional image will be output therefrom.

Note that a transparent glass substrate 5501 may be arranged above the sensor substrates in a manner as shown in FIG. 5 of the accompanying drawings as preventive measures against mechanical impacts and electrolytic corrosion that the photoelectric transfer elements and the TFT devices can be subjected to, taking the high transmittability of light of the glass substrate.

The solid imaging section is rigidly secured to the cabinet 8 as in the case of the radiation imaging section except the anchoring mode on the upper surface of the imaging section within the package. The upper surface of the imaging section and the cabinet 8 are secured to each other by means of keep plates 5403 anchored to the upper surface of the cabinet 8 with screws in an outer region of the transparent glass substrate 5501 located outside the pixel region of the apparatus.

In a large screen image sensor as described above, information on the image of the object is input to the photoelectric transfer elements directly or by way of an optical system comprising lenses and prisms to produce a two-dimensional image.

However, if the cabinet 8 is provided with bent holes 5107, the inside of the cabinet cannot be cooled satisfactorily unless the air in the inside is discharged or replaced effectively and efficiently. The use of means for forced air circulation such as one or more than one fans will obstruct the attempt for producing a down-sized and lightweight imaging apparatus.

Additionally, an uneven temperature distribution of the photoelectric transfer element section can lead to fluctuations in the dark current, which by turn can remarkably differentiate the performance of the photoelectric transfer elements located close to the air vent holes 5107 and that of those located remote from them as the inside of the apparatus is cooled by air entering through the vent holes 5107. Then, the photoelectric transfer elements will not operate for imaging.

SUMMARY OF THE INVENTION

In view of the above listed problems of known imaging apparatus, it is therefore an object of the present invention to provide an imaging apparatus that is compact and lightweight and can be handled with ease.

Another object of the present invention is to provide an imaging apparatus that is conveniently portable and can suitably be used as a cassette.

Still another object of the present invention is to provide an imaging apparatus that is free from the problem of heat emitted from the ICs of the apparatus used for driving devices and for various processing operations, particularly that may arise due to the positions of the photoelectric transfer elements within the apparatus so that it may operate stably and reliably for imaging.

Still another object of the present invention is to provide an imaging apparatus that is down-sized and adapted to emit heat effectively and efficiently and comprise a reduced number of components so that the weight may be significantly reduced.

A further object of the present invention is to provide an imaging apparatus that can input imaging information with an enhanced level of resolution, a high SN ratio and a high tone gradation.

A still further object of the present invention is to provide an imaging apparatus comprising a substrate, photoelectric transfer elements arranged on the substrate, a semiconductor device located in association with the photoelectric transfer elements and a thermal device for discharging heat coming from the semiconductor device to the outside.

DESCRIPTION OF THE PREFERRED EMBODIMENTS

Now, the present invention will be described by referring to the accompanying drawings that illustrate preferred embodiments of the invention.

Figure 1:
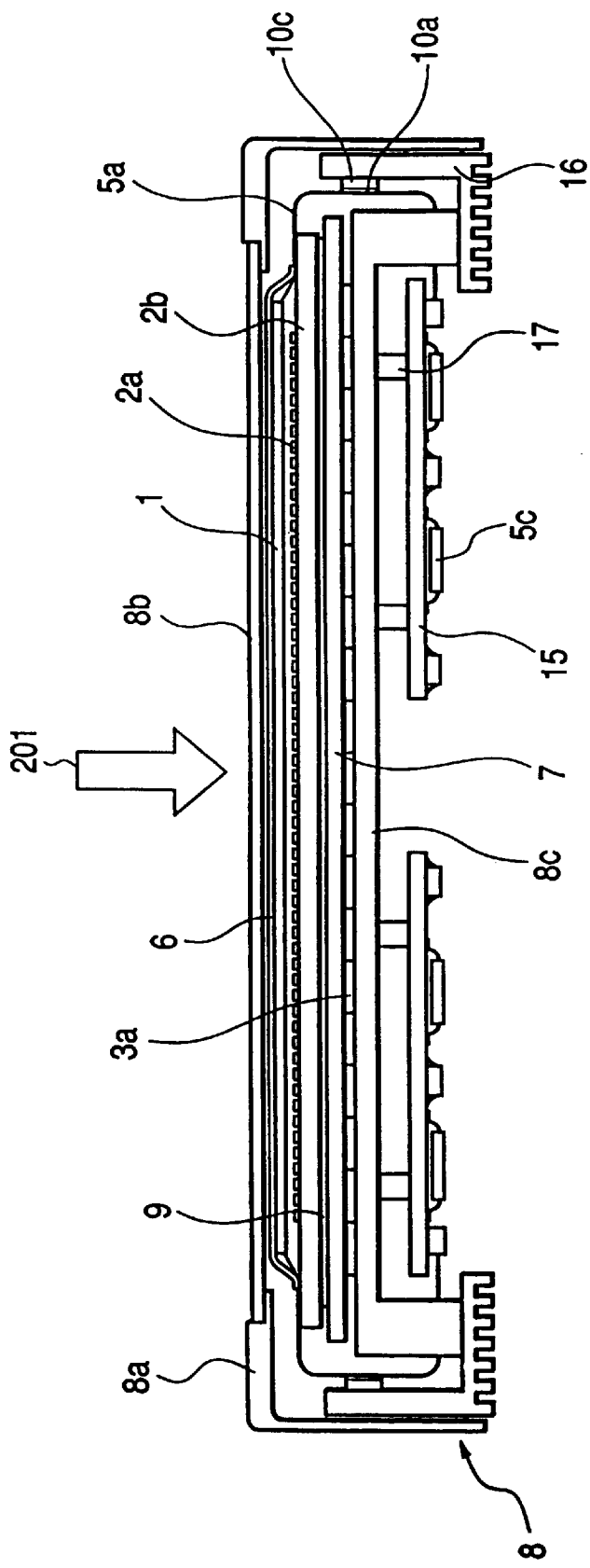
FIGS. 1, 2 and 5 are schematic cross sectional views of an imaging apparatus.
Figure 2:
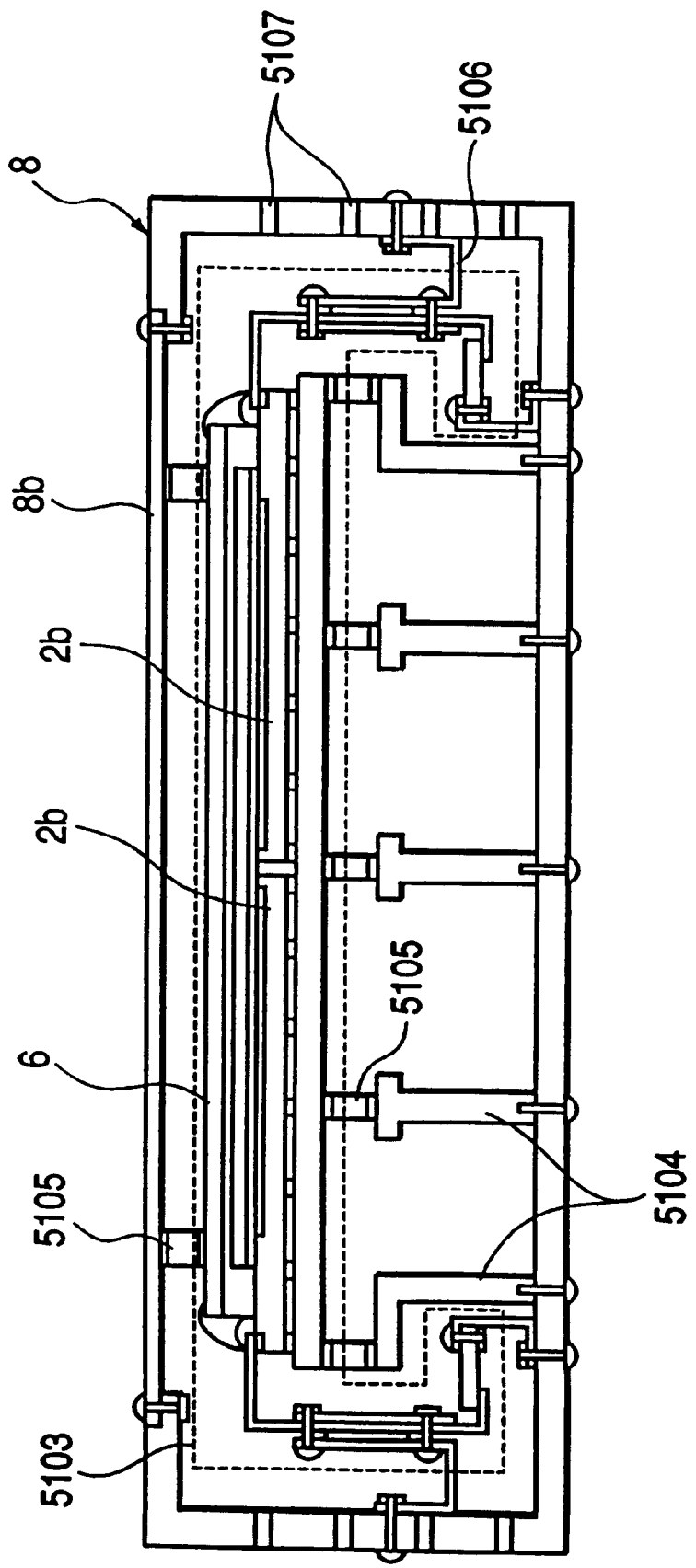
Figure 3:
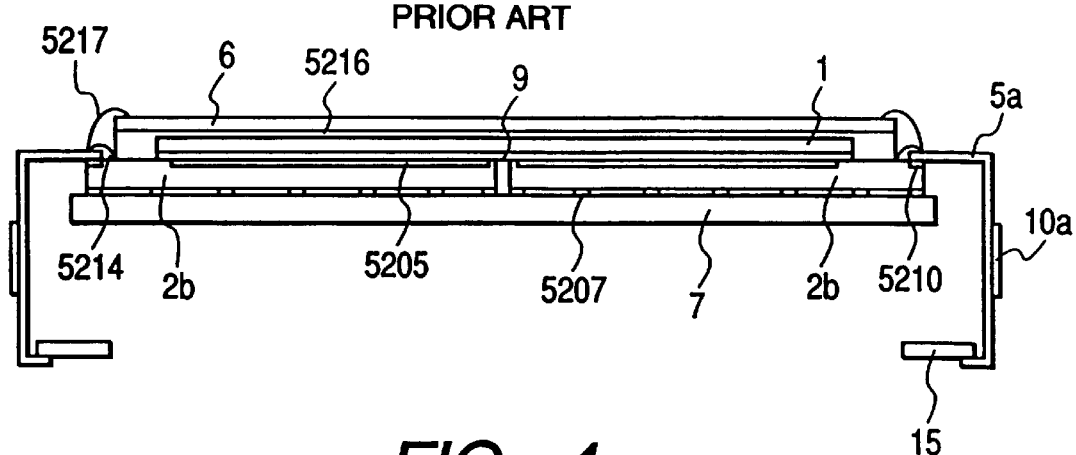
FIG. 3 is a schematic cross sectional view of the imaging section of an imaging apparatus.
Figure 4:
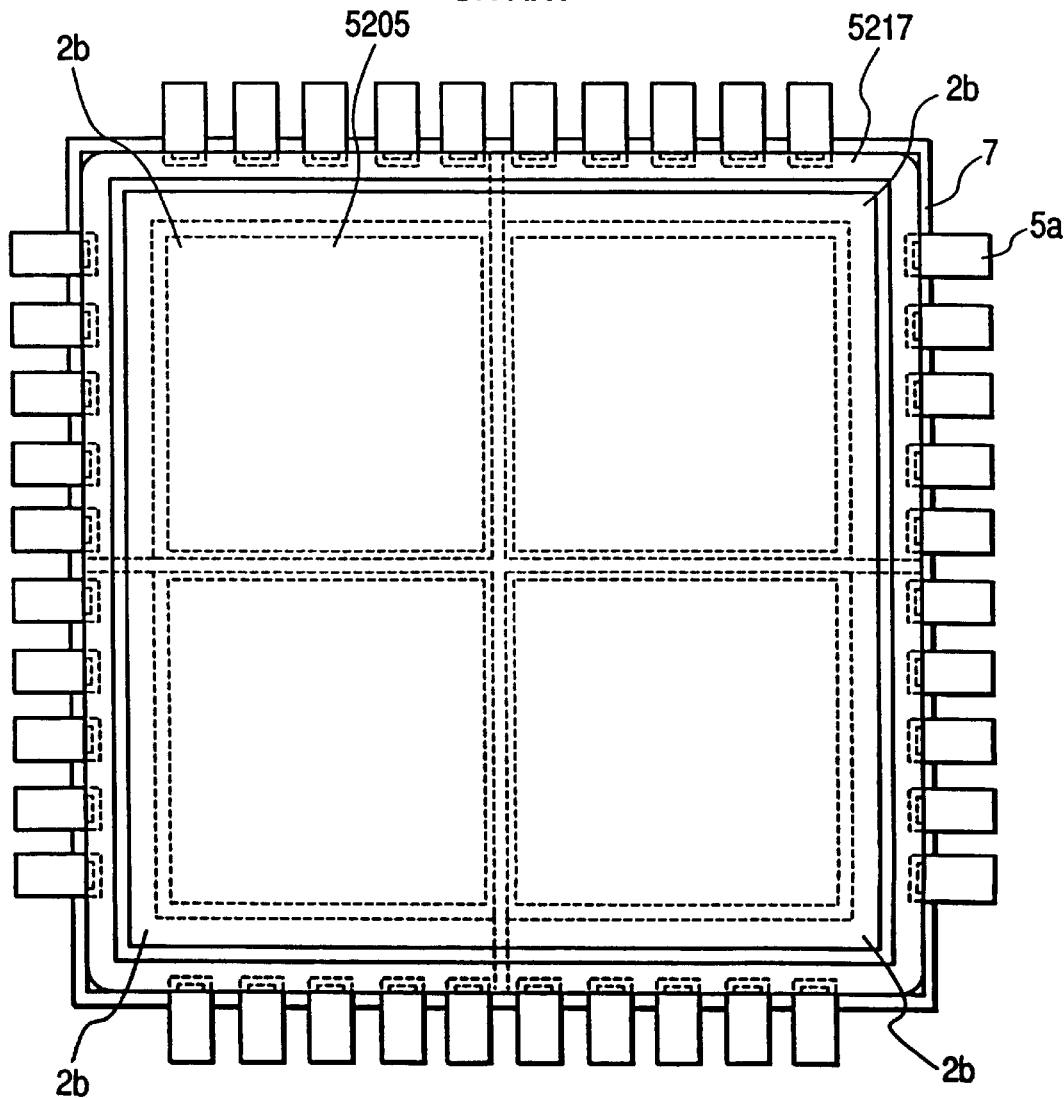
FIG. 4 is a schematic plan view of the imaging section of FIG. 3.
Figure 5:
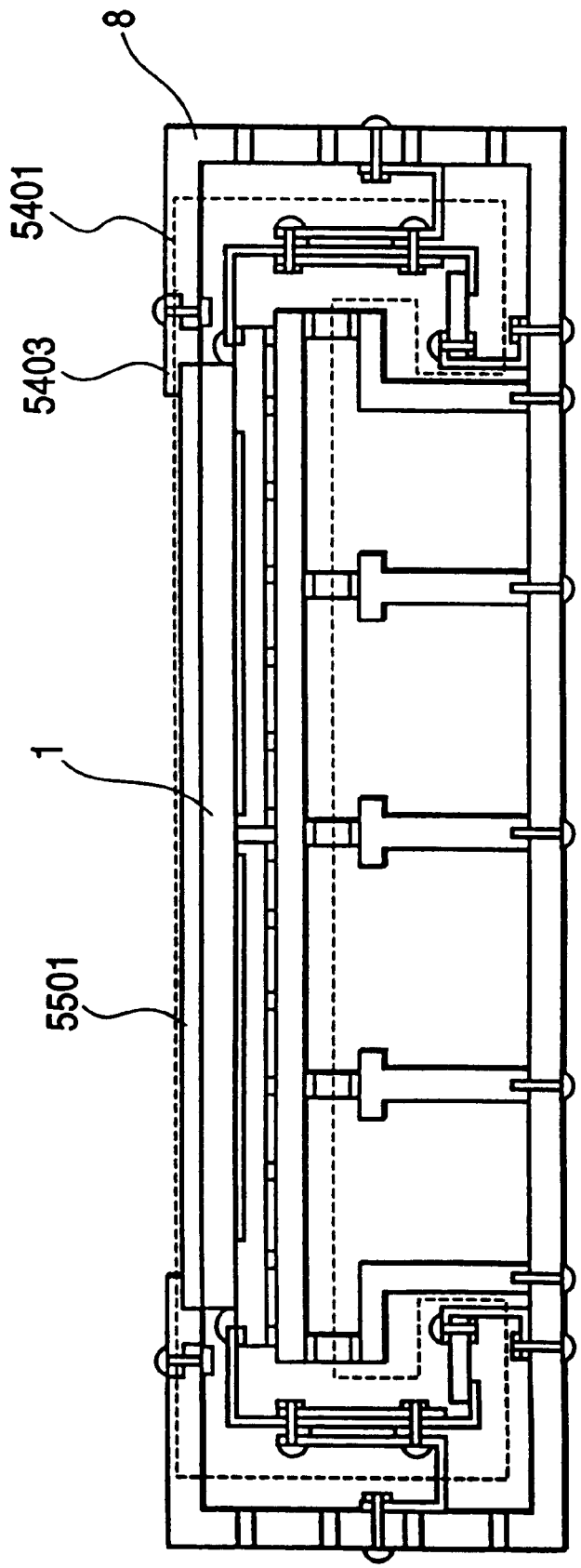
Figure 6:
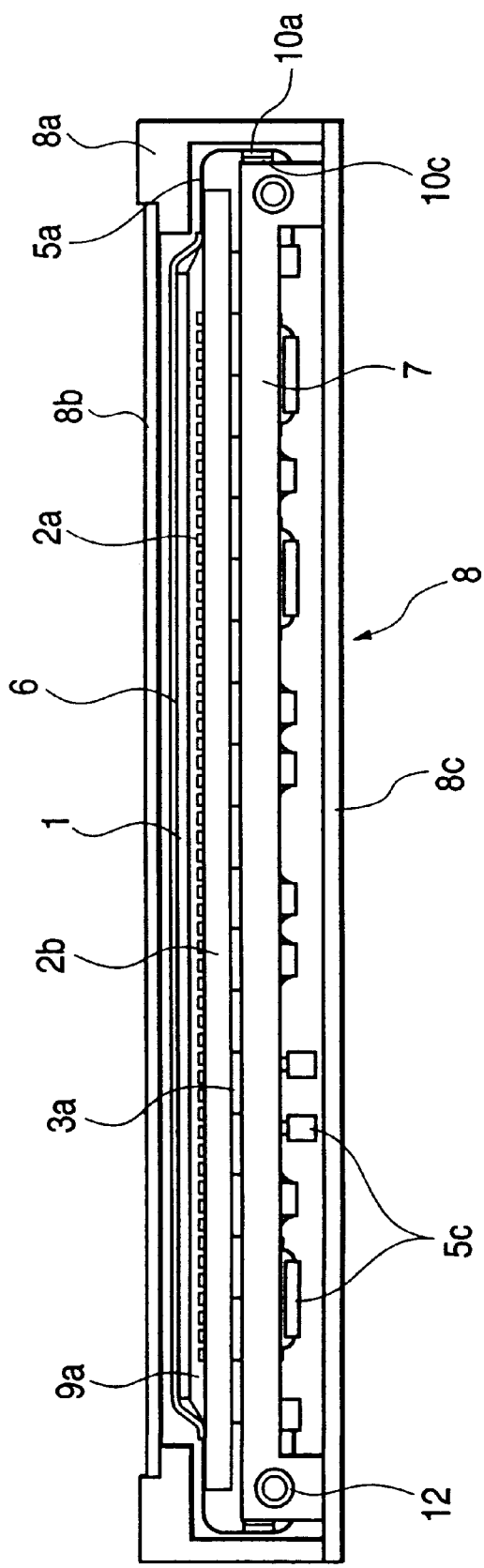
FIGS. 6, 9, 11, 12, 17 and 18 are schematic cross sectional views of imaging apparatus comprising thermal devices.
Figure 7:
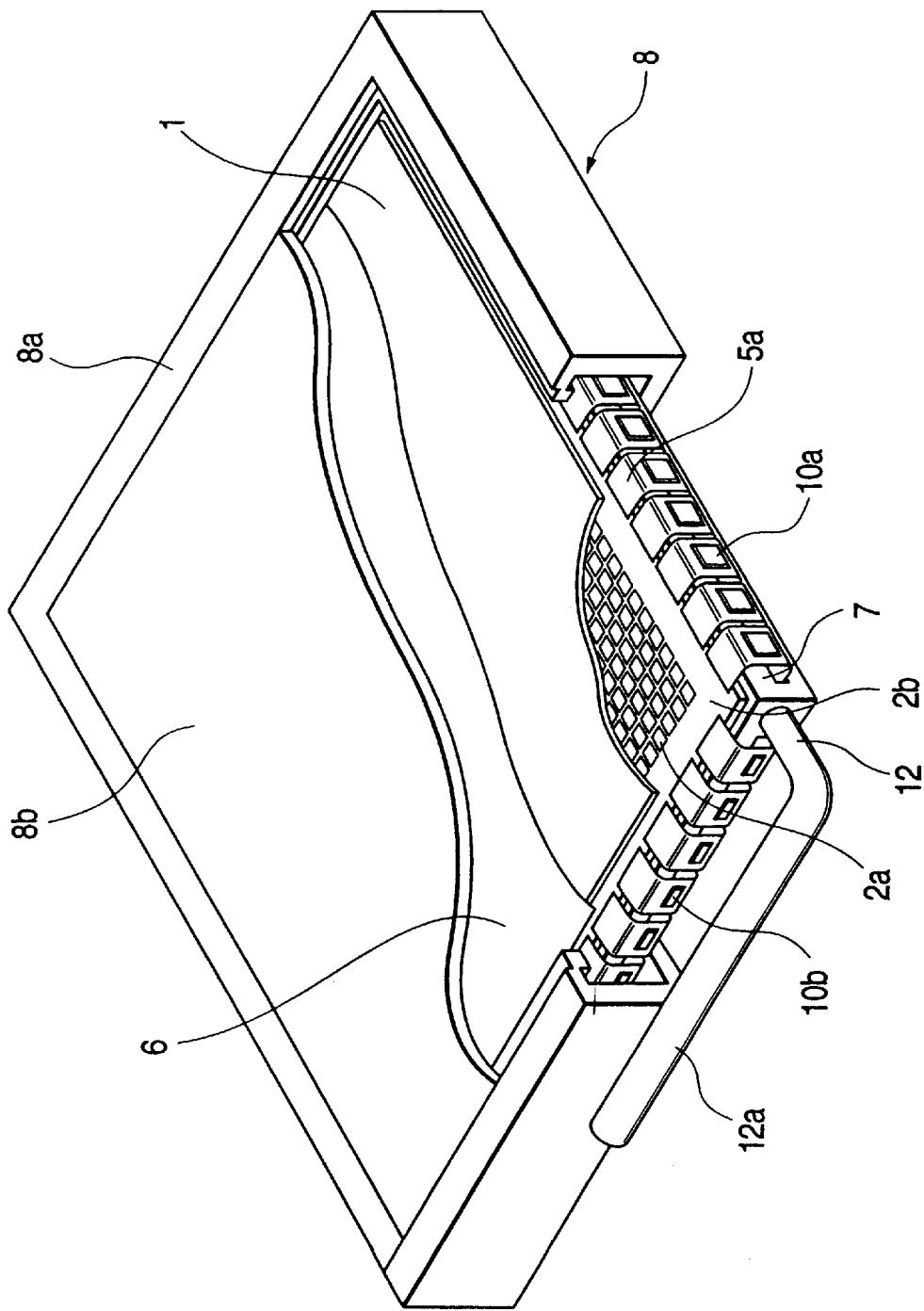
FIGS. 7 and 10 are schematic perspective views of imaging apparatus.

FIG. 6 is a schematic cross sectional view of an embodiment of imaging apparatus according to the present invention. It comprises a metal base plate carrying thereon a glass substrate with photoelectric transfer elements and containing therein heat pipes as heat conduction devices, or thermal devices. FIG. 7 is a schematic perspective view of the imaging apparatus of FIG. 6 and FIG. 8 is a schematic cross sectional view of part of the metal base 7, showing the arrangement of electronic parts thereof.

Referring to FIGS. 6 and 7, there are shown a fluorescent plate 1, photoelectric transfer elements (sensors) 2a, sensor substrates 2b which are glass substrates in this embodiment, signal reading ICs 10a, driver ICs 10b, a base 7 having the role of a drive circuit substrate and that of the bottom section of an apparatus cabinet 8, being made of metal. In this embodiment, it is made of Al and adapted to conduct heat generated in the circuit devices of the drive circuit substrate through the base.

There are also shown TAB films 5a operating as flexible circuit substrates, electronic devices (e.g., semiconductor circuit devices) 5c for driving the photoelectric transfer elements 2a mounted on the TAB films and reading information therefrom, a frame 8a of the apparatus cabinet, a closure 8b of the apparatus cabinet adapted to protect the photoelectric transfer elements 2a from above, an adhesive layer 9a arranged between the sensor substrates 2b and the fluorescent plate 1 and heat pipes 12 buried partly in the base 7 and partly projecting out of the apparatus cabinet 8. Reference symbol 3a denotes spacers for anchoring the glass substrates 2b to the base 7 and reference symbol 12a denotes a heat radiating section of each of the heat pipes 12.

Figure 8:
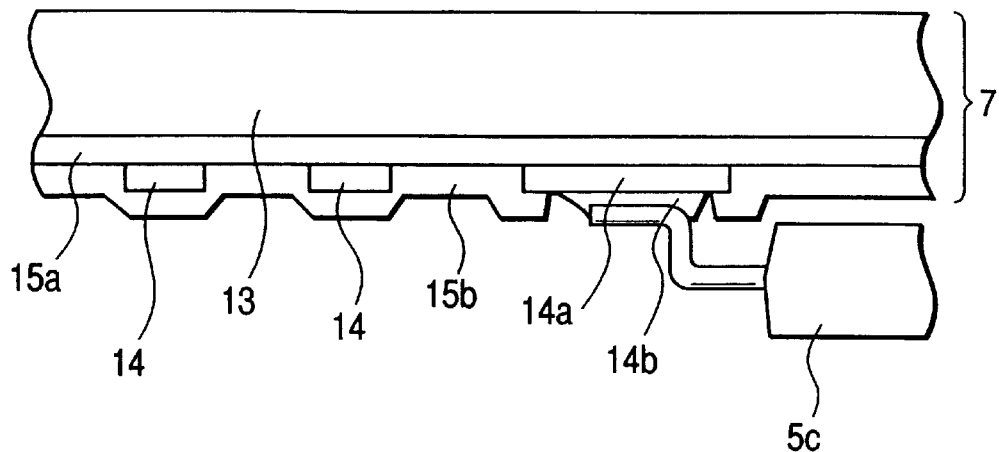
FIG. 8 is a schematic cross sectional view of part of the apparatus of FIG. 7, showing part of its circuit section.

FIG. 8 is a schematic cross sectional view of part of the metal base 7, showing an arrangement of electronic parts and so forth of the drive circuits disposed on the rear surface of the base 7. In FIG. 8, there are shown the principal metal material (Al) 13 of the base 7, circuit wires 14, insulation films 15a and 15b arranged on the principal metal material 13 to prevent any short-circuiting of the principal metal material 13 and the circuit wires 14, pieces of solder resist located on the wires, a conductor section 14a for soldering, a piece of solder 14b arranged for the electronic part 5c. Thus, the drive circuit is formed by applying insulation films 14 on the principal metal material 13 and forming wires thereon and hence the base 7 operates as the drive circuit substrate.

More specifically, a Cu foil is bonded onto the insulation films 14 and subjected to a patterning operation to produce conductor sections 14a for the wires and electronic parts 5c are soldered to the respective conductor sections. Alternatively, solder resist may be applied except the terminal sections for connecting FPCs that operate as wiring members. If necessary, the terminal sections may be surface-treated (e.g., by solder plating) before forming drive circuits. Then, the electronic parts 5c are soldered to the conductor sections 14a to be used for soldering.

When the principal metal material 13 of the base 7 (also operating as the drive circuit substrate) is made of Pb or the surface (at the side of the glass substrates 2b) of the principal metal material 13 is coated with Pb, the electronic parts on the drive circuits can be shield from radiation. In other words, then the principal metal material can operate as radiation blocking member to consequently reduce the overall weight of the imaging apparatus.

Additionally, by using a base 7 having a principal metal material and operating as the drive circuit substrate and by arranging part of the heat pipes 12 that are thermal converters in the base 7, heat generated by the signal reading ICs and the driver ICs can be effectively released to the outside of the imaging apparatus. Thus, liquid contained in the heat pipes 12 within the base 7 is vaporized by heat radiated from the ICs so that heat may be transferred to the heat emitting sections 12a of the heat pipes 12. In the heat emitting sections 12a, gas discharges heat to the outside to become liquid once again, which liquid is then returned to the inside of the base 7 for another heat absorption/discharge cycle.

With the above described arrangement, it is now possible to reduce the temperature difference among ICs without increasing the heat capacity of the principal metal material of the base 7 to radiate heat effectively from the imaging apparatus so that both the size and the weight of the imaging apparatus can be reduced without sacrificing its performance. Additionally, as the base 7 is cooled effectively, the photoelectric transfer elements can show a stable temperature level and operate stably in reading image information.

Figure 9:
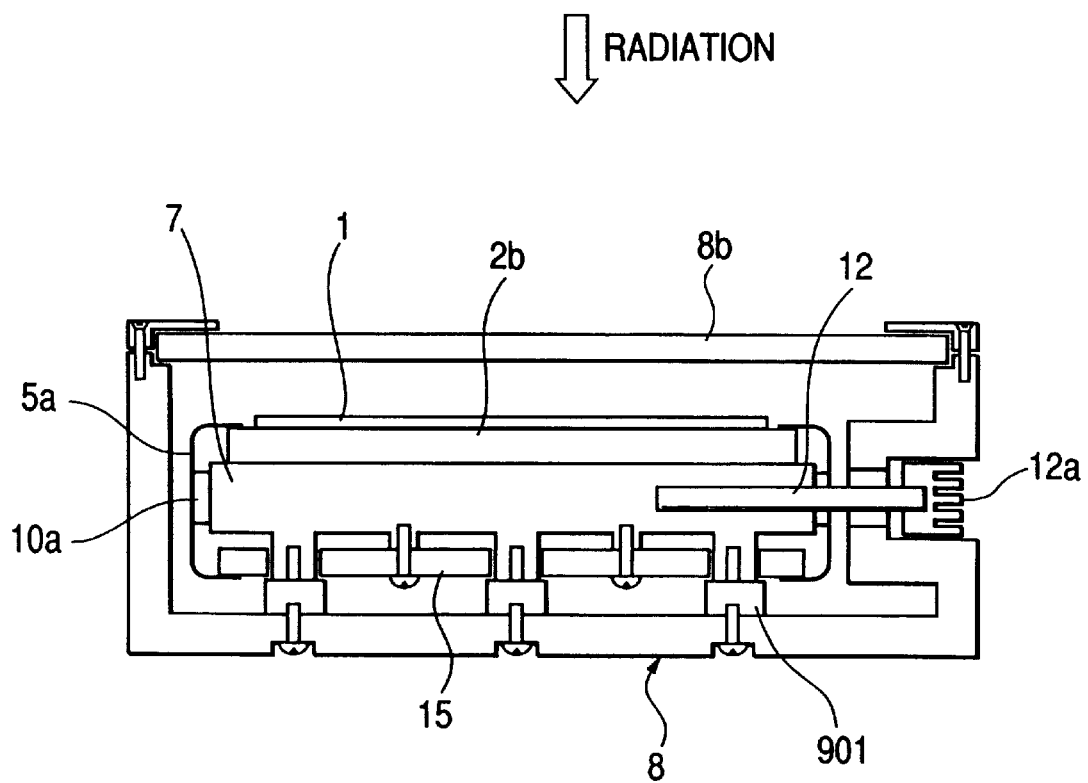

FIG. 9 shows another embodiment using heat pipes.

As seen from the schematic cross sectional view of FIG. 9, each of the heat pipes has an end buried in the base 7 and the other end adapted to operate as heat emitting section 12a that is provided with fins or some other heat emitting means. The cabinet 8 and the base 7 are thermally isolated from each other by means of thermal insulation members 901.

In this embodiment, the thermal energy discharged from the ICs 10a and other sources of heat is transmitted to the base 7 held in contact with the ICs 10a and then released to the outside through the heat emitting sections 12a of the heat pipes. The heat pipes 12 are separated from the cabinet and the base 7 is thermally isolated from the cabinet 8 by means of thermal insulation members 901, the temperature of the cabinet 8 does not rise or hardly rises if the imaging apparatus is operated continuously. Additionally, as the heat emitting sections 12a are not projecting from the cabinet 8 as seen from FIG. 9, the imaging apparatus does not provide any particularly hot areas on the surface in operation as the heat emitting sections are recessed. While an imaging apparatus adapted to photographing the human body by means of X-rays is often brought to contact with the body in operation, the safety of photographing of such an imaging apparatus will be ensured with the recessed arrangement of the heat emitting sections.

Figure 10:
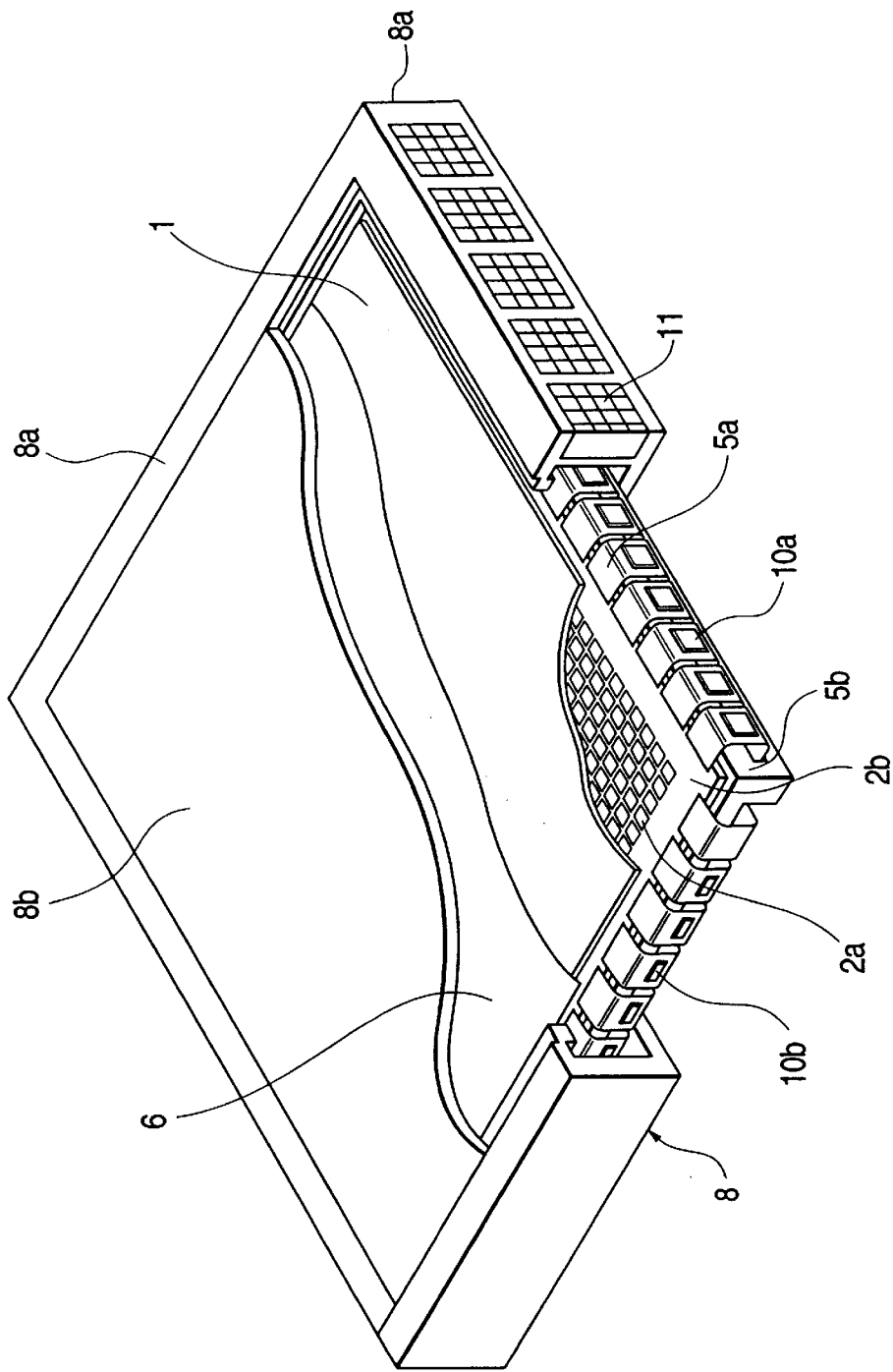

FIG. 10 is a schematic perspective view of another embodiment of imaging apparatus according to the present invention. In this embodiment, the heat pipes of the above embodiments are replaced with thermal devices, more specifically Peltier devices 11 that operate as thermal converters, that are arranged within the frame 8a of the apparatus cabinet 8 and held in contact with the ICs 10a. With this arrangement, heat generated by the signal reading ICs and the driver ICs can be effectively removed by means of the Peltier devices 11 to cool the former. In this embodiment again, as in the preceding embodiments, any possible temperature rise of the ICs and other heat generating devices can be effectively suppressed without obstructing the attempt for reducing the overall weight of the imaging apparatus.

In the instance of the embodiment of FIG. 10, Peltier devices 11 can be arranged individually near the respective devices that emit heat to further reduce the temperature difference among the devices if compared with the above instance of using heat pipes 12 so that both the size and the weight of the imaging apparatus can be further reduced with a satisfactory heat discharge level without raising the thermal capacity of the principal metal material of the base 7.

Now, another embodiment comprising Peltier devices will be described below.

Figure 11:
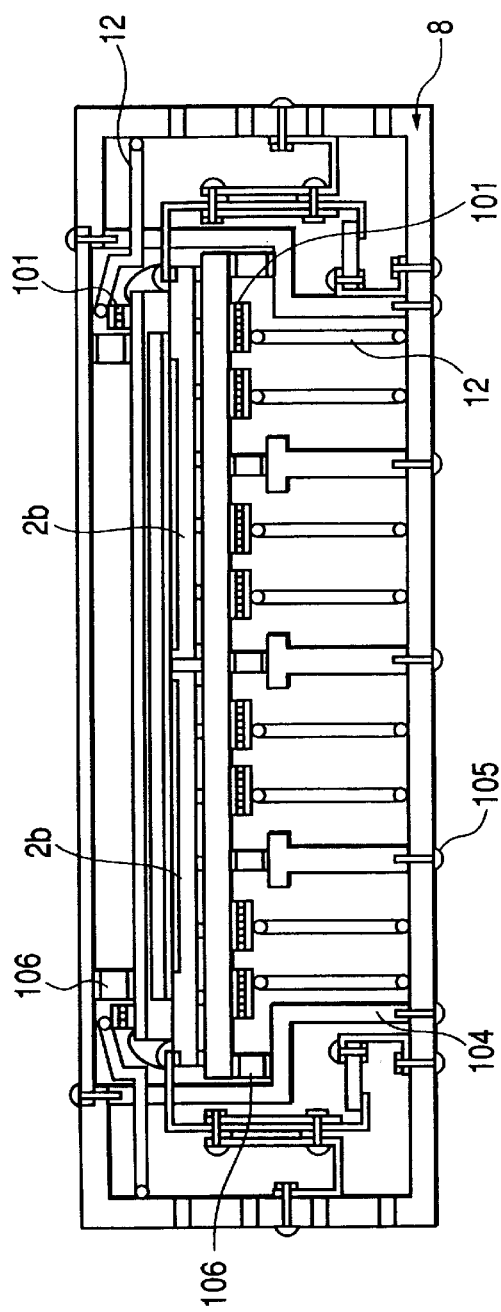
Figure 12:
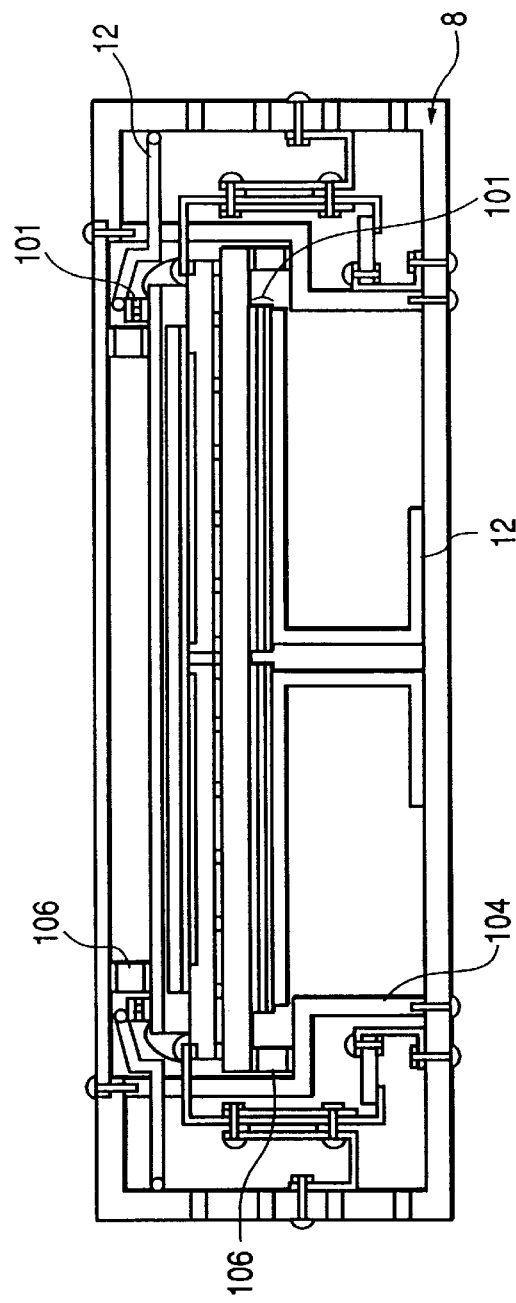
Figure 13:
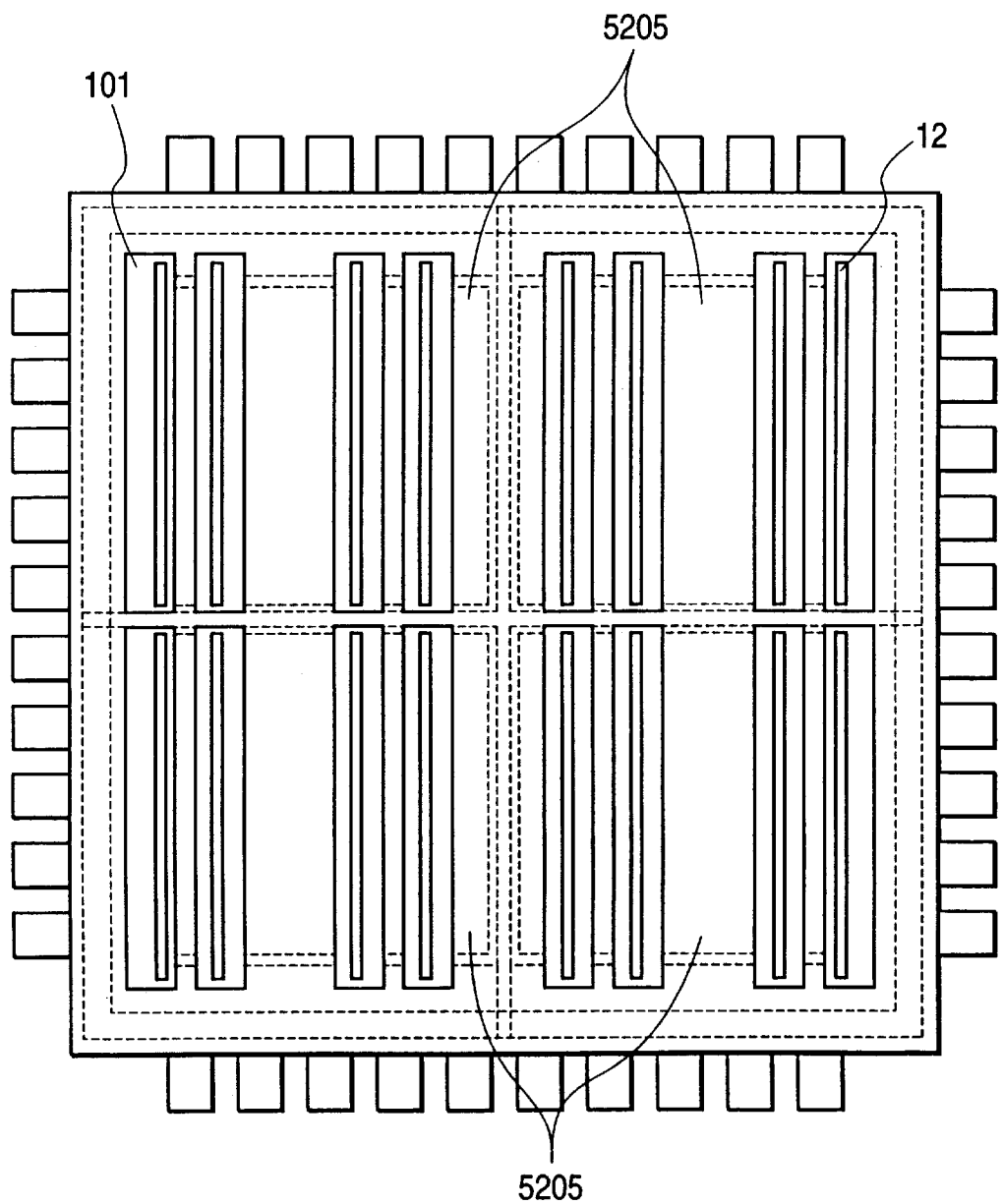
FIGS. 13 and 14 are schematic plan views, illustrating how thermal devices can be fitted to the imaging section.
Figure 14:
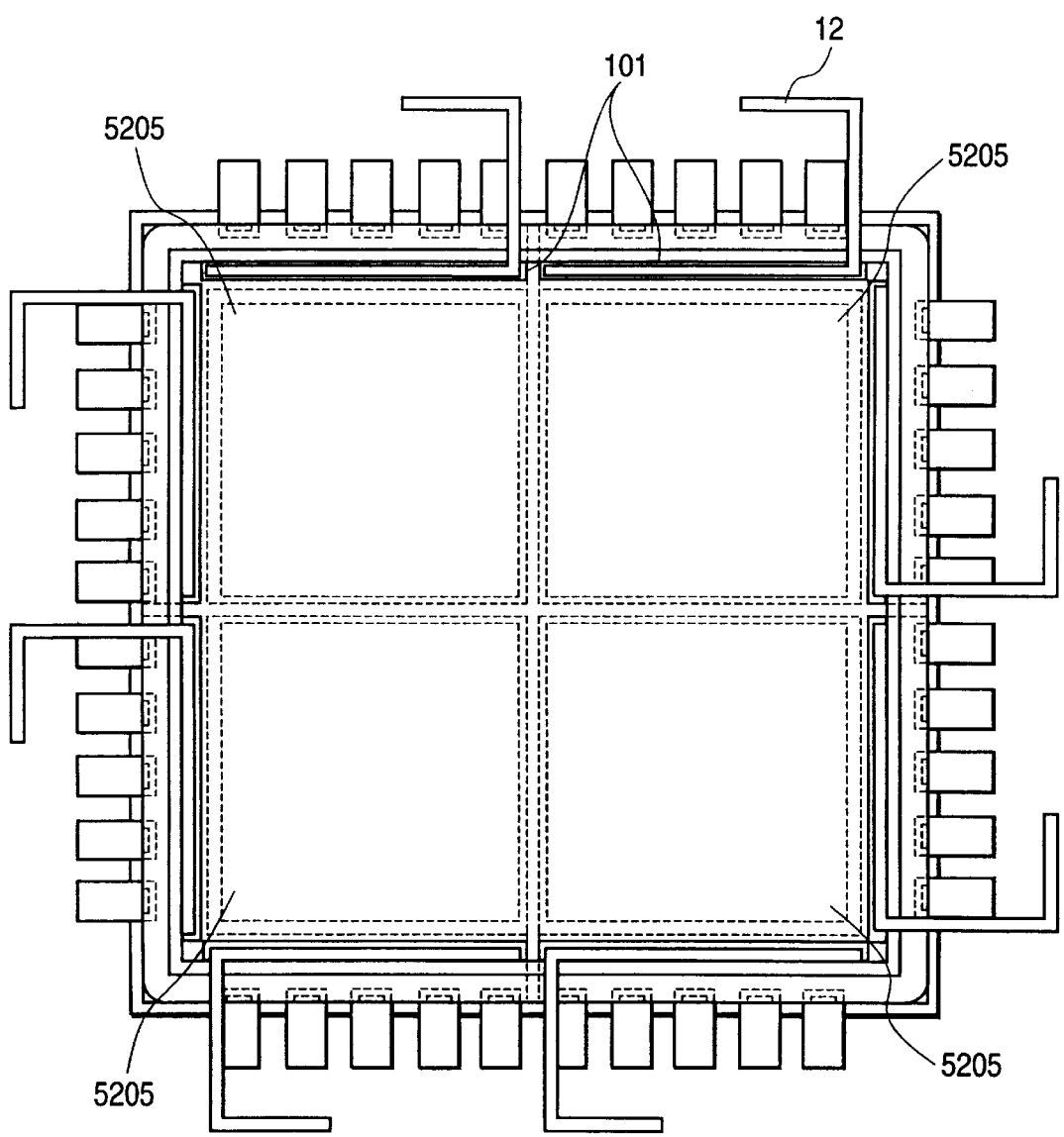
Figure 15:
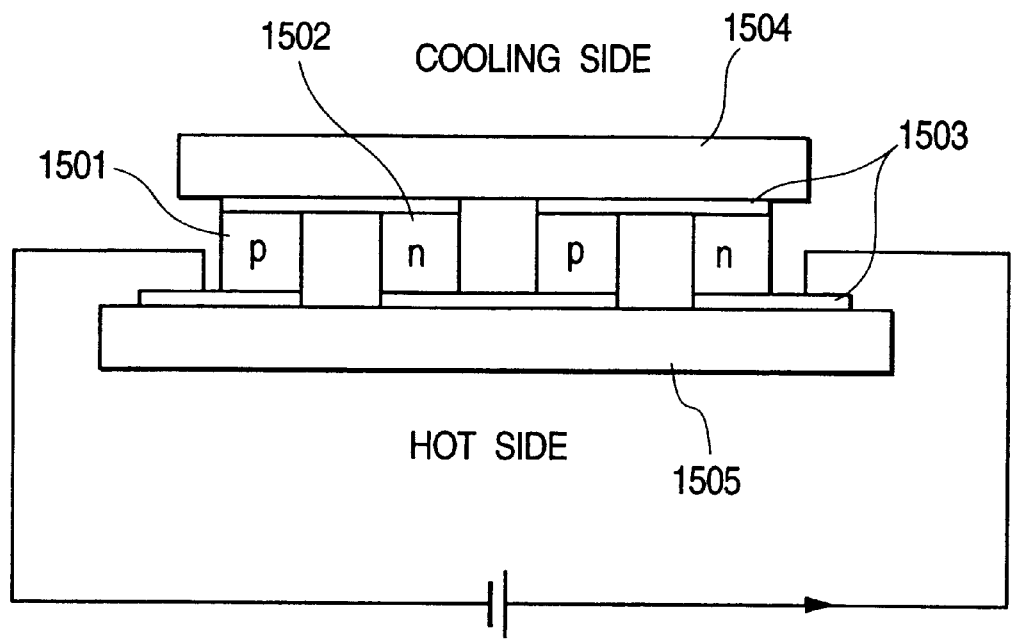
FIG. 15 is a schematic cross sectional view of a Peltier device.

FIGS. 11 and 12 are schematic cross sectional views of another embodiment of imaging apparatus according to the invention as viewed from two different sides. FIGS. 13 and 14 are schematic plan views of the imaging section of the embodiment as viewed from above and from below respectively. Reference numeral 101 in the drawings denotes Peltier devices. FIG. 15 is a schematic lateral view of a single stage Peltier device realized by alternately arranging p-type chips 1501 and n-type chips 1502 typically made of a thermoelectric semiconductor such as $Bi_2Te_3$ on a plane and electrically connecting them in series by way of their ohmic electrodes 1503. The chips are then sandwiched at the opposite surfaces by and rigidly held to a pair of electrically insulated s pacers typically made of aluminum/aluminum nitride. Preferably, the spacers show a thermal conductivity as large as possible. Elements that have to be cooled are fitted to the upper spacer 1504, whereas those that emit heat are fitted to the lower spacer 1505. When the Peltier device is electrically energized, a large number of carriers are forced to move from left to right in FIG. 15 in both the p-type chips and the n-type chips to produce a flow of heat. As a result, the temperature of the top of the device falls, while that of the bottom of the device rises.

In this embodiment, a plurality of Peltier devices 101 are arranged on the rear side of the base, the cooling side of each of the Peltier devices 101 being connected to the rear surface of the base that rigidly holds the sensor substrates. Thus, the base indirectly cool the sensor substrates having a large surface area. In FIG. 13, Peltier devices are arranged in the pixel region 5205 in such a way that they cover a surface area greater than that of the pixel region. However, since the pixel region is the only area that has to be cooled, Peltier devices are preferably arranged only within the pixel region if they have a sufficiently large cooling capacity.

With the above described arrangement, the cooling capacity can be improved by reducing the thermal resistance of the thermal conduction path from the base to the sensor substrates in several different ways. Heat is transferred by way of the Peltier devices, the base, the adhesive agent between the base and the sensor substrates and the sensor substrates. Generally, the thermal resistance is a function of the thermal conductivity and the profile (the area of the cross section, the length along which heat is conducted) of each of the components. Thus, the thermal resistance can be reduced when the components are made of materials having a high thermal conductivity and have a reduced length and a large cross sectional area, provided that they are connected well relative to each other in very minute surface area.

More specifically, the most preferable materials to be used for forming the base and the sensor substrates include metals and alloys such as iron, stainless steel, aluminum, copper, brass, lead and magnesium alloy, ceramic materials such as silicon carbide, beryllia porcelain, aluminum nitride and boron nitride, organic resin such as graphite sheet and metal oxide such as aluminum oxide and ITO, that show a thermal conductivity of not lower than 10 W/m.° C. at room temperature. Glass substrates are preferably used for the sensor substrates in view of forming a semiconductor layer thereon. On the other hand, the base carries thereon a plurality of sensor substrates that are rigidly secured to the base and aligned with each other so as to two-dimensionally show a regular pitch of arrangement of pixels. Therefore, both the sensor substrates and the base are preferably made of a same material so that they show a same thermal expansion coefficient. Glass shows a poor thermal conductivity of about 3

W/m.° C. and, therefore, if glass is used for the sensor substrates, they are preferably coated with metal or metal oxide such as aluminum, chromium or ITO by means of evaporation or plating. The base is subjected to the above process over the entire surface, whereas the above process is conducted at least the pixel region on the rear surface of each of the sensor substrates. As a result, the surface thermal resistance of the components is reduced to provide thermal conduction paths on the surfaces of the components.

The use of a material that is not only thermally highly conductive but also flexible is required for the connection of the sensor substrates, the base and the Peltier devices in order to minimize any possible air gaps that may be produced due to fine undulations on the connection interfaces. Thus, a thermally conductive resin material such as silicon grease or silicon rubber may advantageously be used to connect the above components. If an even higher thermal conductivity is required, a resin material that is an adhesive or agglutinative agent containing solder or electroconductive paste or a powdery material having a thermal conductivity of not lower than 10 W/m.° C. as described above may preferably be used. Alternatively, Peltier devices may be formed directly on the base in order to establish an improved connection between the Peltier devices and the base.

As for the dimensions of the components, it is difficult to specifically define them because commercially available radiation imaging apparatus are remarkably varying in dimensions.

The above description applies to radiation-sensitive imaging apparatus comprising a plurality of small sensor substrates to produce a large surface area. However, if a single sensor substrate having a large surface area is produced, then only Peltier devices will have to be connected to the rear surface of the sensor substrate without using a base. For improving the cooling efficiency, it is preferable to use a material having a high thermal conductivity as described above for the sensor substrate. Then, at least the pixel region of the rear surface of each of the sensor substrates is coated with a material having a thermal conductivity of not lower than 10 W/m.° C. The Peltier devices may be connected to the related sensor substrates either directly or by means of a thermally conductive resin material.

A plurality of Peltier devices may be arranged also on the metal film provided to shield the apparatus from moisture and/or electromagnetic waves in addition to those for cooling the base. FIG. 14 is a plan view of the radiation-sensitive imaging section of an imaging apparatus according to the invention, showing how Peltier devices are arranged. Since Peltier devices are arranged outside and very close to the pixel region to surround the latter in order not to interfere with the passage of X-ray information entering the pixel region but to minimize the thermal resistance and produce an efficient cooling effect. Note that the metal films having the edges covered by the sealing material are located between the sealing material and the pixel region. The Peltier devices and the related metal films are connected by means of a thermally conductive resin material or as the metal films are directly formed on the respective Peltier devices. As a result, the upper surfaces of the sensor substrates will be cooled evenly by way of the metal films, using the metal films as heat diffusion plates.

It should be noted, however, that other cooling means may alternatively be used in place of the Peltier devices arranged on the rear surfaces of the sensor substrates so long as such means can evenly cool the upper surfaces of the sensor substrate to produce a uniform temperature distribution pattern.

Figure 16:
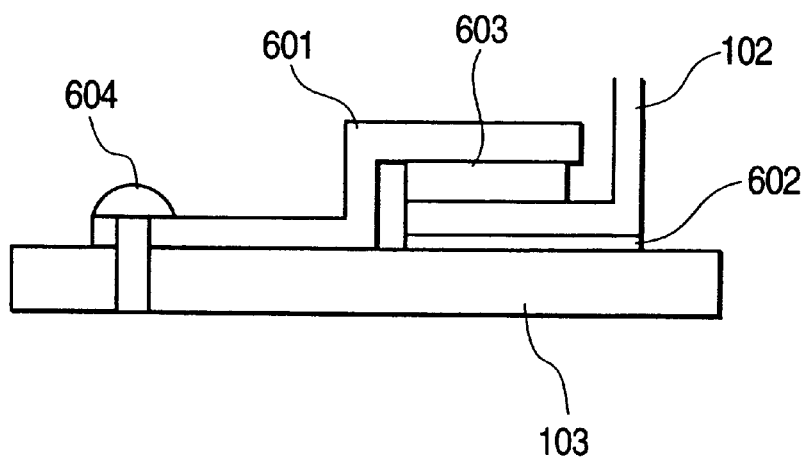
FIG. 16 is a schematic cross sectional view, illustrating how thermal devices can be fitted in position.

Now, the heat emitting sides of the Peltier devices will be described below. In FIGS. 11 through 14, reference numeral 12 denotes heat pipes. When compared with metal that is a conductor of heat, a heat pipe operates far better for transmitting heat, showing a much higher thermal conductivity than metal. The heat pipe are fitted at an end thereof to the heat emitting sides of the respective Peltier devices and at the other end to the cabinet 8 that also shows a high thermal conductivity. The cabinet 8 is typically made of a material that has an excellent mechanical strength and a thermal conductivity not lower than 10 W/m.° C. such as magnesium alloy or aluminum. The heat pipes are preferably deformable so that they may be arranged appropriately in the narrow inside of the cabinet 8 and provide desired paths for heat. The Peltier devices and the heat pipes and the heat pipes and the cabinet will be connected in a manner as will be described below. An adhesive agent or an agglutinative agent containing powdery solder or electrconductive paste showing a thermal conductivity not lower than 10 W/m.° C. will be used to connect the heat pipes and the Peltier devices. As an alternative to the above described arrangement of the heat pipes 12 and the cabinet 8, each heat pipe 12 may be arranged between a metal fitting 601 and the cabinet 8 and pinched at the opposite sides thereof by a thermally conductive resin 602 such as silicon rubber and rubber 603 as shown in FIG. 16 before screw 604 is tightened so that the cabinet 8 and the heat pipe 12 may be securely held in position under the pressure applied by the fitting plate. The heat generated in the Peltier device as a result may be transmitted to the cabinet 8 by way of the heat pipe.

Several techniques have been described for cooling the sensor substrates. However, what is most important is to keep the temperature of the sensor substrates within a desired range regardless of the technique employed for cooling the sensor substrates. Thus, a technique of keeping the temperature of the sensor substrates to a constant level will be discussed below, taking the efficiency of cooling them into consideration. The temperature of the sensor substrates that require cooling may be maintained by keeping them away from direct contact with any components whose temperature is higher than that of the sensor substrates and/or by arranging a closed space around them without causing any significant convention to take place in it. FIGS. 11 and 12 show such an arrangement of keeping the temperature of the sensor substrates within a desired range. Of the support pillars 104, 105 supporting the cabinet 8, the outer support pillars 104 connect the bottom surface and the top surface of the cabinet 8 and surround the four peripheral edges of the assembly of the sensor substrates 2b including the base 7. The support pillars 104 are provided with holes for allowing heat pipes 12 and the flexible circuit substrates to pass therethrough and the gap of each of the holes separating the hole and the heat pipe 12 or the flexible circuit substrate, whichever appropriate, is filled with resin. Thus, the space surrounding the sensor substrates including the base 7 is completely closed by and hermetically sealed by the support pillars 104, the grid and the cabinet 8. The imaging section is rigidly secured to the grid 8b and the support pillars 104 by means of an adhesive agent or an agglutinative agent or by way of anchoring members 106, each carrying an adhesive or an agglutinative agent on the top and under the bottom thereof. The anchoring members 106 are made of a material having a low thermal conductivity that may be a polymer material such as polyethylene resin, epoxy rein or polyurethane resin. As a result, any unnecessary transfer of heat among the sensor substrates 2b, the grid 8b and the support pillars 104 can be suppressed to maintain a desired low level of temperature.

Figure 17:
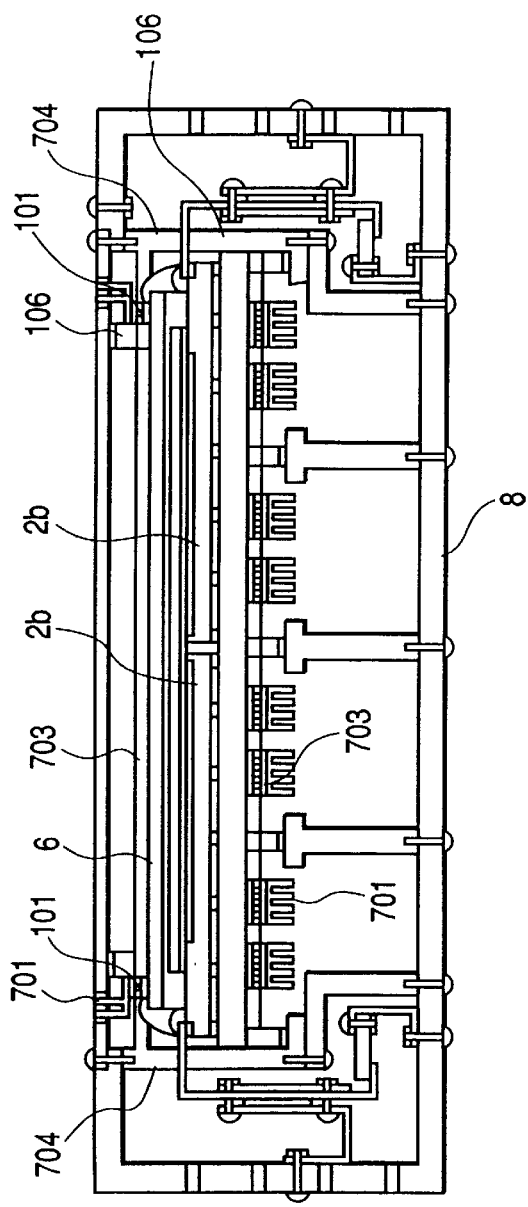
Figure 18:
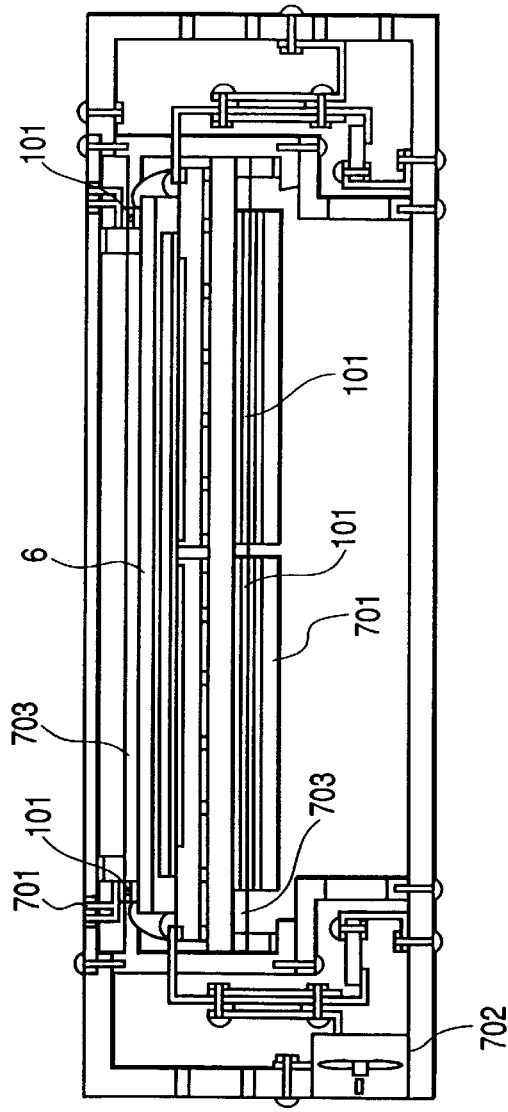

FIGS. 17 and 18 are schematic cross sectional views of a still another embodiment of imaging apparatus according to the invention as viewed along two different directions. In FIGS. 17 and 18, the components same as and similar to their counterparts of the other embodiments will be denoted respectively by the same reference symbols and will not be described further.

This embodiment will be described only in terms of the coolers connected to the respective Peltier devices 101, the method of emission of heat of the coolers and the technique of thermally isolating the cabinet because this embodiment differs from the preceding embodiments only in these terms. A heat sink 701 is arranged on each of the Peltier device 101 in the above described manner. Heat is forcibly released from the heat sink 701 by means of an exhaust fan 702 arranged in a lower portion of the cabinet at the rear surface side of the base. The support pillars and the cabinet are provided with holes for promoting ventilation. On the other hand, the heat sinks 701 arranged on the metal film operating as moisture-proof film 6 are exposed to the outside of the cabinet at the front end thereof through the respective holes bored through the grid so that they may be cooled by ambient air. Thus, heat generated by the Peltier devices is released into ambient air by way of the heat sinks.

Thus, with this embodiment, heat is not emitted to the outside from the outer surface of the cabinet by way of heat pipes 12 as in the case of the preceding embodiment but discharged into the inside of the cabinet by means of heat sinks 701 located near the sensor substrates 2b. Therefore, the related regions should preferably be well ventilated. To achieve this, the sensor substrates 2b including the base 7 are pinched by a pair of insulation plates 703 at the top and at the bottom. The insulation plates 703 have a profile same as the frame surrounded by the support pillars 704 at the four sides and a thickness smaller than the sum of the height of the Peltier devices 101 and that of the heat sinks 701. Additionally, the insulation plates 703 are cut out in areas corresponding to the Peltier devices, the support pillars 704 and the anchoring members 106 of the sensor substrates 2b. The insulation plates are made of a polymer material such as polyethylene resin, epoxy resin or polyurethane resin. The sensor substrates are hermetically sealed by the upper and lower insulation plates and the support pillars and cooled to a desired temperature range.

As described above in detail, according to the present invention, there is provided an imaging apparatus that is compact and lightweight and can be handled with ease.

Additionally, according to the present invention, there is provided an imaging apparatus that is conveniently portable and can suitably be used as a cassette.

Still additionally, according to the present invention, there is provided an imaging apparatus that can effectively cool its semiconductor devices including drive ICs such as photoelectric transfer elements and electric signal processing ICs to stabilize the performance of the semiconductor devices in order to stably output signals with a high SN ratio.

Still additionally, according to the present invention, there is provided an imaging apparatus that can reliably and accurately provide image information because the light receiving section thereof comprising photoelectric transfer elements is so adapted as not to produce or to hardly produce an unnecessary thermal distribution pattern due to heat emitted from the semiconductor devices.

Therefore, the imaging apparatus can provide imaging information with a high tone gradation and an enhanced level of resolution.

Still additionally, with an imaging apparatus according to the present invention, since the base for supporting the glass substrates that carry thereon photoelectric transfer elements also operates as support for the electronic parts used for them and is typically made of aluminum or lead so that both the overall weight and the number of components of the apparatus can be reduced without sacrificing its strength. Therefore, according to the present invention, there is provided a lightweight and compact imaging apparatus that performs excellently for using a radiation source.

Still additionally, an imaging apparatus according to the present invention may comprise thermal converters such as heat pipes or Peltier devices arranged within the metal material of its base or the frame of the apparatus cabinet containing the base so that heat emitted from the drive ICs, the signal reading ICs and the peripheral circuits of the apparatus can effectively be released to the outside. Particularly, when the principal metal material of the base is made of lead, it can also operate as shield for blocking radiation so that the apparatus can efficiently emit heat without making itself bulky by using additional shield member.

Still additionally, an imaging apparatus according to the present invention may comprise thermal converters such as heat pipes or Peltier devices arranged at least in the pixel region on the rear surface of the sensor substrates or of the base rigidly securing the sensor substrates so that a large area can be cooled to show a uniform temperature distribution pattern and the thermal noise and the dark current of the photoelectric transfer elements can be reduced to improve the resolution and realize a high SN ratio. Furthermore, if an imaging apparatus according to the present invention is made to comprise a metal film arranged above the sensor substrates as in the case of a radiation-sensitive imaging apparatus, Peltier devices may be arranged on the metal film in areas not corresponding to the pixel region (non-pixel region) to produce a cooling effect more effective than the one that can be obtained on the upper surface of the sensor substrates and improve the resolution. Still additionally, in an imaging apparatus according to the present invention comprising Peltier devices, the cooling efficiency of any desired portion thereof can be improved to reduce both the power consumption rate of the devices and the operating cost of the apparatus by making such an arrangement that heat generated by the Peltier devices is discharged by way of heat pipes or heat sinks, that the sensor substrates, the base and the adhesive agent are made of respective materials that are thermally highly conductive, that the contact resistance of the components of the apparatus is reduced by using thermally conductive resin and that the sensor substrates are hermetically sealed by means of the cabinet, the support pillars, the grid and the thermal insulators of the apparatus. Such an arrangement is by far less cumbersome than a cooling system using a cooling medium such as liquefied nitrogen or a gaseous cooling medium such as carbon dioxide so that the imaging apparatus can be made very compact and provide an improved maintainability.

Still additionally, in an imaging apparatus according to the present invention, since the heat emitting section can be arranged without projecting from the cabinet, the cabinet and the outer cover that are the outermost components to be put to contact with the object of imaging are kept free from high temperature while heat generated in the inside can be safely released to the outside. Therefore, such an imaging apparatus can be used for a radiation-sensing cassette that is safe and easy to handle.

Thus, an imaging apparatus according to the present invention can meet the demand of the market of medical equipment and imaging equipment for apparatus capable of producing high quality images. For example, the present invention is suitably applicable to radiation-photographing imaging apparatus. When used for such applications, an imaging apparatus according to the present invention can suitably be used for X-ray image diagnosis of the chest, the abdomen or the breast of the patient. More specifically, a large assembly of sensor substrates having a large light receiving area of 100×100 mm to 500×500 mm will be used for such an apparatus so that it can provide high sensitivity/high resolution image information on any fine shade in a minute area of the examined local portion of the body can be detected.

Figure 19:
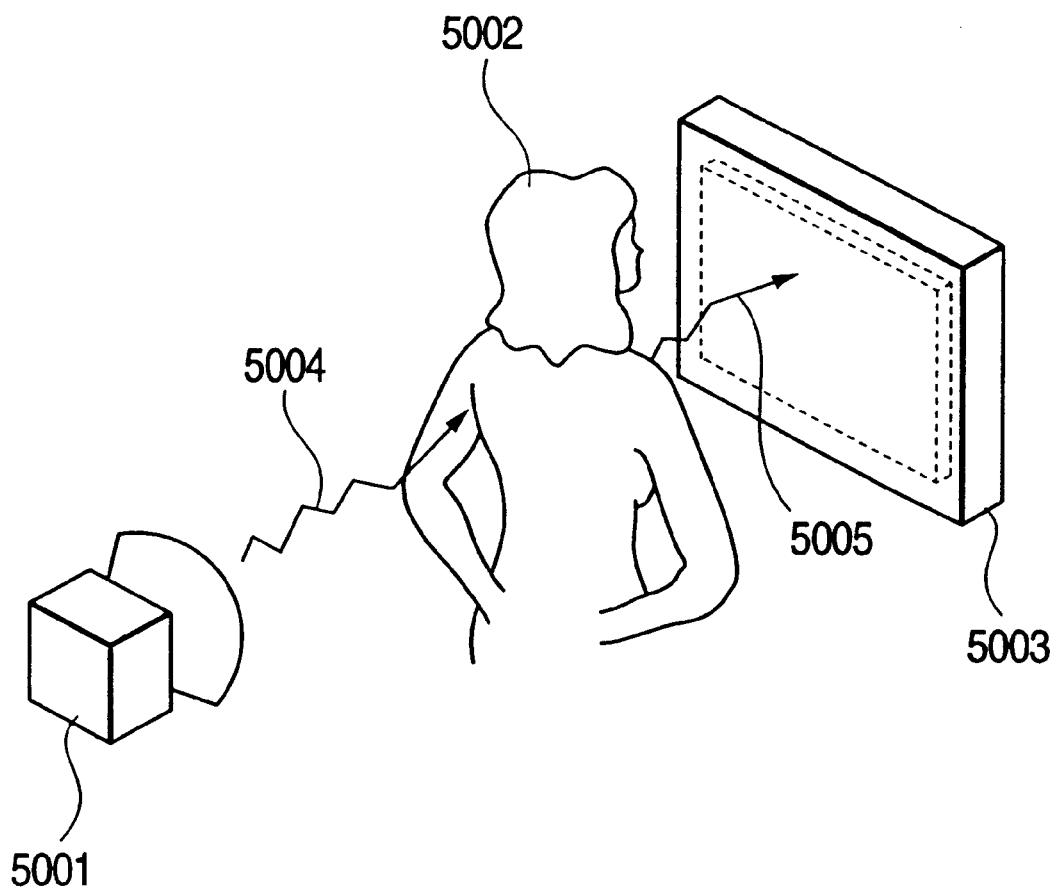
FIG. 19 is a schematic perspective view of an imaging apparatus, illustrating how it is used in an instance of application.

Referring to FIG. 19, showing an ordinary arrangement for X-ray photography, an X-ray image can be obtained by irradiating the subject 5002 with X-rays 5004 emitted from X-ray source 5001 and converting the transmitted X-rays 5005 into electric signals by means the photoelectric transfer elements of the light receiving section of the imaging apparatus 5003.

What is claimed is:

1. An imaging apparatus comprising a substrate, a photoelectric transfer portion having photoelectric transfer elements arranged on said substrate, a semiconductor device located in association with the photoelectric transfer elements, a first thermal device for discharging heat coming from said semiconductor device to the outside by contact with the substrate to cool the photoelectric transfer portion, a moisture-proof film located on said photoelectric transfer elements and a second thermal device for cooling said moisture-proof film.

2. An imaging apparatus comprising a substrate, a photoelectric transfer portion having photoelectric transfer elements arranged on said substrate, a semiconductor device located in association with the photoelectric transfer elements, a first thermal device for discharging heat coming from said semiconductor device to the outside by contact with the substrate to cool the photoelectric transfer portion, a moisture-proof film located on said photoelectric transfer elements and a second thermal device for cooling said moisture-proof film, wherein said second thermal device includes a heat conduction device.

3. An imaging apparatus comprising a substrate, a photoelectric transfer portion having photoelectric transfer elements arranged on said substrate, a semiconductor device located in association with the photoelectric transfer elements, a first thermal device for discharging heat coming from said semiconductor device to the outside by contact with the substrate to cool the photoelectric transfer portion, a moisture-proof film located on said photoelectric transfer elements and a second thermal device for cooling said moisture-proof film, wherein said second thermal device includes a heat conduction device and wherein said heat conduction device has a heat pipe.

4. An imaging apparatus comprising a substrate, a photoelectric transfer portion having photoelectric transfer elements arranged on said substrate, a semiconductor device located in association with the photoelectric transfer elements, a first thermal device for discharging heat coming from said semiconductor device to the outside by contact with the substrate to cool the photoelectric transfer portion, a moisture-proof film located on said photoelectric transfer elements and a second thermal device for cooling said moisture-proof film, wherein said second thermal device includes a Peltier device.

* * * * *